US009973167B2

United States Patent
Shi et al.

(10) Patent No.: US 9,973,167 B2
(45) Date of Patent: May 15, 2018

(54) IMPEDANCE MATCHING CIRCUIT AND METHOD FOR RADIO FREQUENCY TRANSMISSION COIL

(71) Applicant: Shenyang Neusoft Medical Systems Co., Ltd., Shenyang (CN)

(72) Inventors: Jianhua Shi, Shenyang (CN); Hongbing Hu, Shenyang (CN); Huidong Gu, Shenyang (CN); Haiquan Li, Shenyang (CN); Hongwei Wang, Shenyang (CN); Lin Wu, Shenyang (CN); Haobo Jin, Shenyang (CN)

(73) Assignee: Shenyang Neusoft Medical Systems Co., Ltd., Shenyang (CN)

( * ) Notice: Subject to any disclaimer, the term of this patent is extended or adjusted under 35 U.S.C. 154(b) by 92 days.

(21) Appl. No.: 15/231,571

(22) Filed: Aug. 8, 2016

(65) Prior Publication Data

US 2017/0093364 A1 Mar. 30, 2017

(30) Foreign Application Priority Data

Sep. 25, 2015 (CN) .......................... 2015 1 0622089
Jun. 8, 2016 (CN) .......................... 2016 1 0409153

(51) Int. Cl.
*H03H 7/38* (2006.01)
*H03H 7/40* (2006.01)
*G01R 33/36* (2006.01)

(52) U.S. Cl.
CPC ........... *H03H 7/40* (2013.01); *G01R 33/3628* (2013.01)

(58) Field of Classification Search
CPC ............................. H03H 7/40; G01R 33/3628
(Continued)

(56) References Cited

U.S. PATENT DOCUMENTS 4,638,253 A 1/1987 Jaskolski et al.
4,731,585 A 3/1988 Fox
(Continued)

FOREIGN PATENT DOCUMENTS

CN 85106858 A 7/1986
CN 85106858 A 7/1986
(Continued)

OTHER PUBLICATIONS

Ayano Enomoto et al; XP028372387—"Sequential CW-EPR image acquisition with 760-MHz surface coil array" Journal of Magnetic Resonance; vol. 209 , No. 2; Jan. 26, 2011 (Jan. 26, 2011), pp. 244-249; ISSN: 1090-7807.
(Continued)

*Primary Examiner* — Stephen E Jones
(74) *Attorney, Agent, or Firm* — Fish & Richardson P.C.

(57) ABSTRACT

Impedance matching circuits and methods for radio frequency (RF) transmission coil are disclosed. An example impedance matching circuit includes a coil matching circuit, a RF power detection circuit, and a spectrometer. The spectrometer outputs an output voltage reversely applied on a varactor diode of the coil matching circuit. An impedance of the coil matching circuit is changed based on the output voltage. The spectrometer outputs a RF transmission signal to the RF power detection circuit, receives a power of a RF reflected signal corresponded to the output voltages. The spectrometer receives powers of different RF reflected signals corresponded to different output voltages, and assigns an output voltage corresponded to a minimum power of the RF reflected signals as an impedance matching voltage, where an equivalent impedance of the coil matching circuit and the RF transmission coil matches with an impedance of RF transmission lines.

10 Claims, 9 Drawing Sheets

(58) Field of Classification Search
USPC .................................................. 333/17.3, 32
See application file for complete search history.

(56) References Cited

U.S. PATENT DOCUMENTS

| | | | |
|---|---|---|---|
| 5,793,162 A * | 8/1998 | Barnes | H01J 37/32082 315/111.21 |
| 2003/0146750 A1 | 8/2003 | Vaughan, Jr. | |
| 2008/0111548 A1 | 5/2008 | Yamamoto et al. | |
| 2013/0285659 A1 | 10/2013 | Sohn et al. | |
| 2014/0139218 A1 | 5/2014 | Findeklee et al. | |
| 2015/0253398 A1 | 9/2015 | Ferrand et al. | |

FOREIGN PATENT DOCUMENTS

| | | |
|---|---|---|
| CN | 103389480 A | 11/2013 |
| JP | 61-73061 A | 4/1986 |
| JP | 61-200450 A | 9/1986 |

OTHER PUBLICATIONS

BL Beck et al; XP040618514—"High Q Reactive Network for Automatic Impedance Matching" Proceedings of the International Society for Magnetic Resonance in Medicine, ISMRM,19th Annual Meeting and Exhibition, Montreal, Quebec, May 7-13, 2011; Apr. 23, 2011 (Apr. 23, 2011) , p. 1853.

* cited by examiner

```
if (PowerCorrespond2CurrentVoltage == PowerMin)
then {
      OutputVoltageStartValue := VoltageCorrespond2MiniPower;
      StepValue := StepValue - StepDifferenceValue;
      OutputVoltage := OutputVoltageStartValue + StepValue;
      }
```

FIG. 11

IMPEDANCE MATCHING CIRCUIT AND METHOD FOR RADIO FREQUENCY TRANSMISSION COIL

CROSS REFERENCE TO RELATED APPLICATIONS

This application claims priority under 35 U.S.C. § 119 to Chinese Patent Applications CN 201510622089.X filed on Sep. 25, 2015 and CN 201610409153.0 filed on Jun. 8, 2016. The contents of these priority applications are hereby incorporated by reference in their entireties.

TECHNICAL FIELD

The present disclosure relates to impedance matching of a radio frequency (RF) transmission coil.

BACKGROUND

According to the function, the RF coils of a magnetic resonance (MR) imaging system may be divided into the RF reception coil and the RF transmission coil. In some cases, the RF transmission coil may be used only for transmitting the radio frequency (RF) signal. In some other cases, the RF transmission coil may be used for transmitting the radio frequency signal and receiving the magnetic resonance signal.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

SUMMARY

One aspect of the invention features an impedance matching circuit for a radio frequency (RF) transmission coil, including: a coil interface circuit configured to output a RF transmission signal in a RF transmission state or to output a RF received signal in a RF reception state; a coil matching circuit serially coupled between the RF transmission coil and the coil interface circuit through a plurality of direct current (DC) blocking devices, the coil matching circuit comprising a varactor diode; a RF power detection circuit coupled to the coil interface circuit and configured to detect power of a RF forward signal and power of a RF reflected signal in the RF transmission state; and a spectrometer configured to: output an output voltage to the coil matching circuit, the output voltage being reversely applied on the varactor diode, an impedance of the coil matching circuit being changed based on the output voltage on the varactor diode, output a RF transmission signal to the RF power detection circuit after outputting the output voltage, receive the power of the RF forward signal and the power of the RF reflected signal corresponded to the output voltage, and assign a particular output voltage corresponding to a minimum power of the RF reflected signal as an impedance matching voltage which causes an equivalent impedance of the coil matching circuit and the RF transmission coil to match with an impedance of RF transmission lines.

The coil matching circuit can further include a plurality of RF blocking devices, and the output voltage outputted from the spectrometer to the coil matching circuit can be reversely applied on the varactor diode through the plurality of RF blocking devices.

In some embodiments, a first output terminal of the coil matching circuit is coupled to a first input terminal of the RF transmission coil through a first DC blocking device of the plurality of DC blocking devices; a second output terminal of the coil matching circuit is coupled to a second input terminal of the RF transmission coil through a second DC blocking device of the plurality of DC blocking devices; a first input terminal of the coil matching circuit is coupled to a first output terminal of the coil interface circuit through a third DC blocking device of the plurality of DC blocking devices; a second input terminal of the coil matching circuit is coupled to a second output terminal of the coil interface circuit through a fourth DC blocking device of the plurality of DC blocking devices; and a third input terminal of the coil matching circuit is connected to a first output terminal of the spectrometer.

In some cases, the coil matching circuit includes the varactor diode, a first RF blocking device, and a second RF blocking device, and a first terminal of the first RF blocking device is the third input terminal of the coil matching circuit; a second terminal of the first RF blocking device is connected to a cathode of the varactor diode; an anode of the varactor diode is coupled to a ground through the second RF blocking device; the cathode of the varactor diode is the first input terminal of the coil matching circuit; the anode of the varactor diode is the first output terminal of the coil matching circuit; and the second output terminal of the coil matching circuit is shorted with the second input terminal of the coil matching circuit.

In some cases, coil matching circuit comprises the varactor diode, a third RF blocking device, and a fourth RF blocking device; and the first output terminal of the coil matching circuit is shorted with the first input terminal of the coil matching circuit; a first terminal of the third RF blocking device is the third input terminal of the coil matching circuit; a second terminal of the third RF blocking device is connected to a cathode of the varactor diode; an anode of the varactor diode is coupled to a ground through the fourth RF blocking device; the cathode of the varactor diode is the second input terminal of the coil matching circuit; and the anode of the varactor diode is the second output terminal of the coil matching circuit.

In some cases, the coil matching circuit includes a first varactor diode, a second varactor diode, a first RF blocking device, a second RF blocking device, a third RF blocking device, and a fourth RF blocking device; and a first terminal of the first RF blocking device is the third input terminal of the coil matching circuit; a second terminal of the first RF blocking device is connected to a cathode of the first varactor diode; an anode of the first varactor diode is coupled to a ground through the second RF blocking device; the cathode of the first varactor diode is the first input terminal of the coil matching circuit; the anode of the first varactor diode is the first output terminal of the coil matching circuit; the second terminal of the first RF blocking device is connected to a first terminal of the third RF blocking device; a second terminal of the third RF blocking device is connected to a cathode of the second varactor diode; an anode of the second varactor diode is coupled to the ground through the fourth RF blocking device; the cathode of the second varactor diode is the second input terminal of the coil matching device; and the anode of the second varactor diode is the second output terminal of the coil matching device.

In some examples, the RF power detection circuit includes a first directional coupler and a second directional coupler, and a terminal of the first directional coupler is coupled to a second output terminal of the spectrometer through a RF amplifier; an output terminal of the first directional coupler is connected to an output terminal of the second directional coupler; a coupling terminal of the first directional coupler is connected to a first input terminal of the spectrometer; an input terminal of the second directional coupler is connected to the coil interface circuit; and a coupling terminal of the second directional coupler is connected to a second input terminal of the spectrometer. The second output terminal of the spectrometer can output the RF transmission signal to the input terminal of the first directional coupler through the RF amplifier after outputting the output voltage from the first output terminal of the spectrometer to the coil matching circuit, and the coupling terminal of the first directional coupler can output the power of the RF forward signal corresponded to the output voltage to the first input terminal of the spectrometer, and the coupling terminal of the second directional coupler can output the power of the RF reflected signal corresponded to the output voltage to the second input terminal of the spectrometer.

In some embodiments, the coil interface circuit includes at least one of a RF power divider/mixer, a first RF switch, a second RF switch, a fifth DC blocking device, a sixth DC blocking device, a seventh DC blocking device, an eighth DC blocking device, a transmission power absorption load, a reception power absorption load, or a preamplifier; and a first terminal of the RF power divider/mixer is connected to a first terminal of the first RF switch; a second terminal of the first RF switch is coupled to the RF power detection circuit through the fifth DC blocking device; a third terminal of the first RF switch is coupled to a first terminal of the reception power absorption load through the sixth DC blocking, and a second terminal of the reception power absorption load is connected to a ground; a second terminal of the RF power divider/mixer is connected to a first terminal of the second RF switch; a second terminal of the second RF switch is coupled to a first terminal of the transmission power absorption load through the seventh DC blocking, and a second terminal of the transmission power absorption load is connected to the ground; a third terminal of the second RF switch is coupled to the preamplifier through the eighth DC blocking; the preamplifier is connected to the spectrometer; a third terminal of the RF power divider/mixer is coupled to a second input terminal of the coil matching circuit through a DC blocking device; and a fourth terminal of the RF power divider/mixer is coupled to a first input terminal of the coil matching circuit through a DC blocking device.

In some cases, the coil interface circuit further includes: a first switch signal driver having a first terminal connected to the spectrometer and a second terminal coupled to the RF transmission coil through a fifth RF blocking device, the first switch signal driver receives a coil state control signal from the spectrometer, and the first switch signal driver transmits a coil detuning state driving signal or a resonant state driving signal to the RF transmission coil; and a second switch signal driver having a first terminal connected to the spectrometer and a second terminal coupled to the first RF switch and the second RF switch through a sixth RF blocking device, the second switch signal driver receives a coil state control signal from the spectrometer, and the second switch signal driver transmits a RF transmission state driving signal to the first RF switch and the second RF switch.

Another aspect of the invention features an impedance matching method of matching a radio frequency (RF) transmission coil, including: repeatedly outputting an output voltage to a coil matching circuit, then outputting a RF transmission signal to a RF power detection circuit, and receiving a power of a respective RF reflected signal corresponded to the output voltage from the RF power detection circuit, where the output voltage is reversely applied on a varactor diode of the coil matching circuit and an impedance of the coil matching circuit is changed based on the output voltage reversely applied on the varactor diode; and assigning a particular output voltage corresponding to a minimum power of the received RF reflected signals to be an impedance matching voltage, where an equivalent impedance of the coil matching circuit and the RF transmission coil matches with an impedance of RF transmission lines. The equivalent impedance can include a sum of impedance of the coil matching circuit and impedance of the RF transmission coil.

Before outputting voltage to the coil matching circuit, the method can further include: initializing to set up an output voltage start value, a step value, and a maximum voltage standing wave ratio. After first time outputting the output voltage to the coil matching circuit, the method can further include: calculating a voltage standing wave ratio based on a power of a first time RF forward signal and a power of a first time RF reflected signal corresponded to the first time output voltage, the first time RF forward signal and the first time RF reflected signal being received from the RF power detection circuit after outputting a first time RF transmission signal to the RF power detection circuit; in response to a determination of the calculated voltage standing wave ratio being not greater than the maximum voltage standing wave ratio, assigning the power of the RF reflected signal corresponded to the first time output voltage as a minimum power of the RF reflected signal; and in response to a determination of the calculated voltage standing wave ratio being greater than the maximum voltage standing wave ratio, performing an exit operation.

The method can further include receiving a power of a RF reflected signal corresponded to a current output voltage; in response to a determination of the power of the RF reflected signal corresponded to the current output voltage being less than the minimum power of the received RF reflected signals, assigning the power of the RF reflected signal corresponded to the current output voltage as the minimum power of the received RF reflected signals, adding a value of the current outputted voltage with a current step value, and assigning the added value to be a new current output voltage; in response to a determination of the power of the RF reflected signal corresponded to the current output voltage being not less than the minimum power of the RF reflected signal and the current step value being capable to be decreased, setting up a new output voltage start value and a new step value and obtaining a plurality of powers of the RF forward signals and a plurality of powers of the RF reflected signals corresponded to the new output voltage start value and the new step value; and in response to a determination of the power of the RF reflected signal corresponded to the current output voltage being not less than the minimum power of the RF reflected signal and the current step value being incapable to be decreased, assigning a voltage corresponding to the minimum power of the received RF reflected signals as an impedance matching voltage.

In some cases, the setting up the new output voltage start value and the new step value further includes: in response to a determination of the power of the RF reflected signal corresponded to the current output voltage being equal to the minimum power of the received RF reflected signals, assigning the voltage corresponding to the minimum power to be a new value of the output voltage start value, subtracting the current step value with a predetermined step difference value and assigning the subtracted step value to be a new value of the step value, and adding the new output voltage start value and the new step value and assigning the added value to be a new value of the current output voltage; and in response to a determination of the power of the RF reflected signal corresponded to the current output voltage being greater than the minimum power of the received RF reflected signals, subtracting the voltage corresponding to the minimum power with the current step value and assigning the subtracted value to be a new value of the output voltage start value, and subtracting the current step value with the predetermined step difference and assigning the subtracted step value to be a new value of the step value, and adding the new output voltage start value and the new step value and assigning the added value to be a new value of the current output voltage under a condition that the new output voltage start value is great than a previous output voltage start value.

In some cases, the assigning the voltage corresponding to the minimum power of the received RF reflected signals as an impedance matching voltage further include: in response to a determination of the power of the RF reflected signal corresponded to the current outputted voltage being equal to the minimum power, assigning a mean value of the current output voltage and a previous output voltage as the impedance matching voltage; and in response to a determination of the power of the RF reflected signal corresponded to the current output voltage being more than the minimum power, assigning the voltage corresponding to the minimum power as the impedance matching voltage.

The details of one or more embodiments of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

BRIEF DESCRIPTION OF DRAWINGS

FIG. 11 is a schematic diagram of pseudo-code corresponding to block 1009 of FIG. 10 according to an example of the present disclosure.

DETAILED DESCRIPTION

Figure 1:
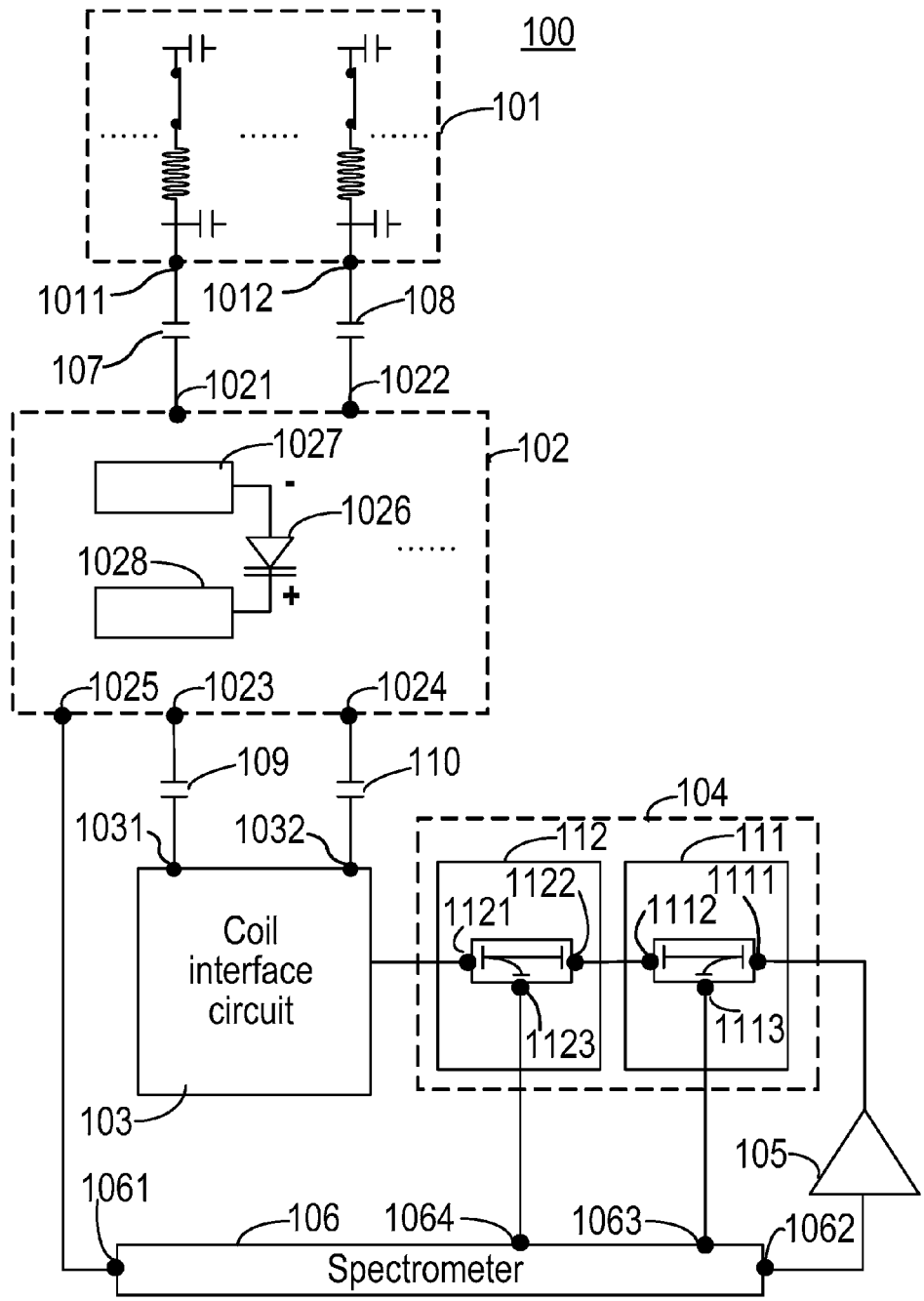
FIG. 1 is a schematic view of an example impedance matching circuit for a radio frequency transmission coil according to the present disclosure.

In an MR imaging system, if an impedance of a RF transmission coil (or an equivalent impedance of the RF transmission coil and a coil matching circuit) is matching with an impedance of transmission lines, then a reflection power of a RF signal is the minimum, when the RF signal is transmitting from the transmission lines to the RF transmission coil. It may ensure that the output power of the RF signal of the RF transmission coil is the maximum so as to ensure the quality of MR images. The transmission lines can be connected between the RF transmission coil and a RF power amplifier.

In some cases, the impedance of the transmission lines may be set to a fixed value, e.g., 50 ohms, where the transmission lines are connected between the RF transmission coil and the RF power amplifier. The impedance of the RF transmission coil also may be set to the same value, e.g., 50 ohms, so as to implement the impedance matching of the RF transmission coil and the transmission lines. When the MR imaging system generates MR images for different patients with different body figures, the equivalent capacitance of the RF transmission coil may be changed from patient to patient. Thus, the impedance of the RF transmission coil may be changed and the impedance of RF transmission coil may be mismatched with the impedance of the transmission lines.

In some systems, in order to ensure that the impedance of the RF transmission coil is matching with the impedance of RF transmission lines, a matching device uses mutual inductance to couple a nuclear magnetic resonance RF coil to a RF power amplifier and a RF receiver preamplifier. In the matching device, the RF coil and the matching coil are regarded as an integrated device. The matching coil is positioned relative to the RF coil at a location having the maximum RF flux density in the resonant frequency of the RF coil. The angle of the matching coil is manually rotated such that the effective area of the RF flux of the matching coil enclosed in the RF field may be changed and the coupling coefficient between the matching coil and the RF coil may also be changed. From the aforementioned method, the equivalent impedance of the matching coil and the RF coil may be matched with the impedance of the transmission lines, thus it may ensure that the power of the RF signal transmitted from the RF coil is maximum.

Implementations of the present disclosure are generally directed to methods, devices, and systems for matching an impedance of a RF transmission coil, e.g., to an impedance of RF transmission lines in a MR imaging system. In some implementations, an impedance matching circuit includes a coil matching circuit coupled to the RF transmission coil and a spectrometer coupled to the coil matching circuit. The spectrometer can output an output voltage to the coil matching circuit, which is reversely applied on a varactor diode of the coiling matching circuit. An impedance of the coil matching circuit can be changed based on the output voltage applied on the varactor diode. The spectrometer can repeatedly output a RF transmission signal, e.g., to a RF power detection circuit, after outputting the output voltage. The RF power detection circuit is coupled to the coil matching circuit, e.g., through a coil interface circuit. The spectrometer receives a power of a RF reflected signal corresponded to the output voltage, e.g., from the RF power detection circuit. Consequently, the spectrometer can receive a plurality of powers of different RF reflected signals corresponded to a plurality of different output voltages and assign a particular output voltage corresponding to a minimum power of the powers of the RF reflected signals as an impedance matching voltage. The minimum power indicates that an equivalent impedance of the coil matching circuit and the RF transmission coil matches with an impedance of the RF transmission lines. In such a way, the impedance matching circuit can adjust the output voltage of the spectrometer to ensure that the equivalent impedance of the coiling matching circuit and the RF transmission coil matches with the impedance of the RF transmission lines, thereby to maximize an output power of the RF signal of the RF transmission coil so as to ensure the quality of MR images.

FIG. 1 is a schematic view of an impedance matching circuit 100 for a radio frequency (RF) transmission coil according to the present disclosure. As shown in FIG. 1, the impedance matching circuit 100 comprises a RF transmission coil 101, a coil matching circuit 102, a coil interface circuit 103, a RF power detection circuit 104, a RF amplifier 105, and a spectrometer 106. The coil interface circuit 103 is configured to output a RF transmission signal in a RF transmission state or to output a RF received signal in a RF reception state. Where, in order to excite a magnetic resonance phenomenon, the coil interface circuit 103 may switch into the RF transmission state, and the RF transmission signal may be output in such a quadrature manner that the real and imaginary parts of the RF transmission signal are mutually orthogonal, i.e., there is a phase relationship of 90° between the real and imaginary parts of the RF transmission signal. Further, in order to receive a magnetic resonance signal, the coil interface circuit 103 may switch into the RF reception state, and the received signal may be output in such a mixed manner that the real and imaginary parts of the RF received signal are mutually orthogonal, i.e., there is a phase relationship of 90° between the real and imaginary parts of the RF received signal. The coil matching circuit 102 is serially coupled between the RF transmission coil 101 and the coil interface circuit 103 by a plurality of direct current (DC) blocking devices 107, 108, 109, 110. The RF power detection circuit 104 is connected to the coil interface circuit 103, and is configured to detect power of a RF forward signal and power of a RF reflected signal in the RF transmission state.

In some implementations, the coil matching circuit 102 includes a varactor diode 1026. The varactor diode 1026 can be a diode configured to exploit the voltage-dependent capacitance of a reversed-biased p-n junction. The spectrometer 106 may output a voltage to the coil matching circuit 102, the output voltage may be reversely applied on the varactor diode 1026, i.e., the output voltage is applied on the varactor diode 1026 in such a manner that the higher voltage end is connected to the cathode of the varactor 1026 and the lower voltage end is connected to the anode of the varactor diode 1026, and an impedance of the coil matching circuit 102 may be changed based on the voltage on the varactor diode 1026. After outputting the output voltage, the spectrometer 106 may output a RF transmission signal to the RF power detection circuit 104, receive the power of the RF forward signal and the power of the RF reflected signal corresponded to the output voltage, and assign a voltage which is corresponding to a minimum power of the RF reflected signal as an impedance matching voltage, in which an equivalent impedance of the coil matching circuit 102 and the RF transmission coil 101 is matching with an impedance of RF transmission lines (not shown here). For example, the spectrometer 106 may include a processor to analyse a number of powers of the RF reflected signals corresponding to a number of output voltages respectively and determine a minimum power of the RF reflected signal as the impedance matching voltage.

In a MR imaging system, when a RF signal is transmitting from the RF transmission coil 101 to the transmission lines, if the impedance of the RF transmission coil is matching with the impedance of the transmission lines, the reflection power of the RF signal is the minimum, which may ensure that the output power of the RF signal of the RF transmission coil 101 is the maximum so as to better produce "better" MR images. Generally, using maximum output power is associated with greater resolution, more accuracy, less noise per unit of power expended, and better ability to perceive detail and discrepancies in the underlying tissue. The transmission lines can be connected between the RF transmission coil 101 and a RF power amplifier.

In some cases, the RF transmission coil 101 may be used only for transmitting the radio frequency signal. The RF transmission coil 101 also may be used for transmitting the radio frequency signal and receiving the magnetic resonance signal. When the RF transmission coil 101 is used for transmitting the radio frequency signal and receiving the magnetic resonance signal, the RF transmission coil 101 may be called as a Transmitting/Receiving coil.

A first output terminal 1021 of the coil matching circuit 102 may be coupled to a first input terminal 1011 of the RF transmission coil 101 through a first DC blocking device 107. A second output terminal 1022 of the coil matching circuit 102 may be coupled to a second input terminal 1012 of the RF transmission coil 101 through a second DC blocking device 108. A first input terminal 1023 of the coil matching circuit 102 may be coupled to a first output terminal 1031 of the coil interface circuit 103 through a third DC blocking device 109. A second input terminal 1024 of the coil matching circuit 102 may be coupled to a second output terminal 1032 of the coil interface circuit 103 through a fourth DC blocking device 110. Wherein, the DC blocking device may include a capacitive component that prevents the flow of direct current while offering minimum interference to a RF signal.

In some implementations, the coil matching circuit 102 includes a varactor diode 1026, a first RF blocking device 1027, and a second RF blocking device 1028. A third input terminal 1025 of the coil matching circuit 102 may be connected to the first output terminal 1061 of the spectrometer 106. Where, the RF blocking device may be a band trap or a band rejection filter to block the RF signal passing into designated area.

Figure 2:
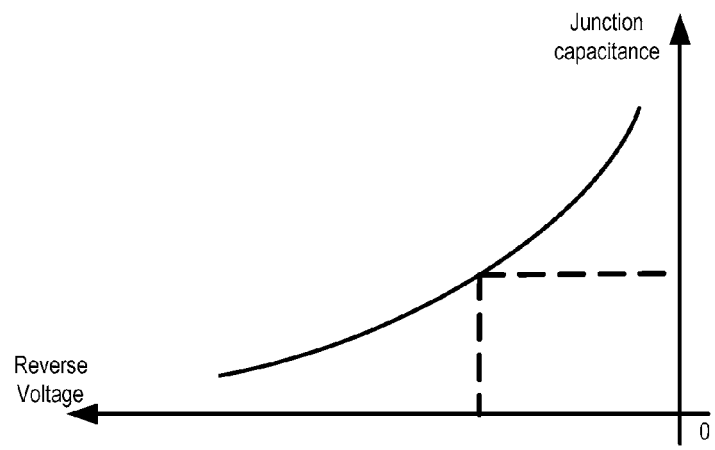
FIG. 2 is a schematic diagram of an example relationship between reverse voltage applied on a varactor diode and junction capacitance of the varactor diode.

The first output terminal 1061 of the spectrometer 106 may repeatedly, e.g., cyclically, output a plurality of voltages to the third input terminal 1025 of the coil matching circuit 102. Each of the plurality of voltages is reversely applied on the varactor diode 1026 of the coil matching circuit 102. The junction capacitance of the varactor diode 1026 is decreasing when the reverse voltage applied on the varactor diode 1026 is increasing. It is because, when the varactor diode 1026 is operated in a reverse-biased state, no DC current flows through the device. The amount of reverse bias controls the thickness of the depletion zone and therefore the junction capacitance of the varactor diode. Generally, the depletion region thickness is proportional to the square root of the applied voltage, and capacitance is inversely proportional to the depletion region thickness. Thus, the capacitance is inversely proportional to the square root of applied voltage. FIG. 2 is a schematic diagram of a relationship between the reverse voltage applied on the varactor diode and junction capacitance of the varactor diode 1026. The variation of the junction capacitance of the varactor diode 1026 may change the impedance of the varactor diode 1026.

Figure 3:
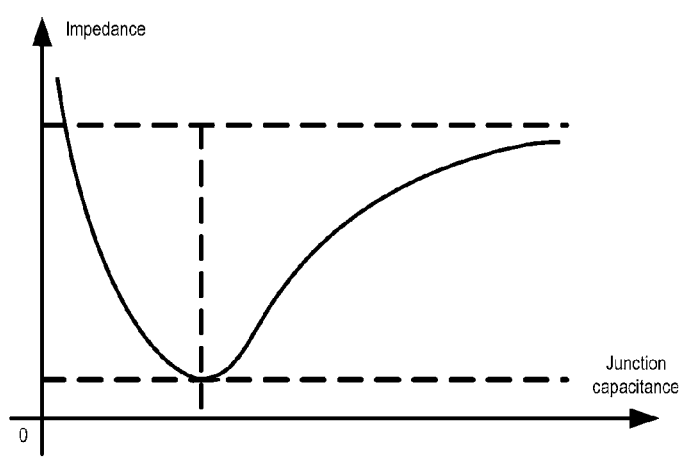
FIG. 3 is a schematic diagram of an example relationship between junction capacitance of a varactor diode and impedance of a coil matching network.

FIG. 3 is a schematic diagram of a relationship between junction capacitance of the varactor diode 1026 and impedance of a coil matching network according to present disclosure, where the coil matching network comprises the RF transmission coil 101. The coil matching network may include its own equivalent inductance and equivalent capacitance, where the equivalent capacitance may include the junction capacitance of varactor diode. As shown in FIG. 3, the most left portion in FIG. 3 may represent the capacitive load, i.e., the capacitive reactance is larger than the inductive reactance. With the junction capacitance of the varactor diode 1026 increasing, the total impedance of the coil matching network decreases. When the equivalent capacitance reactance is matching with the equivalent inductance reactance, the coil matching network may be acting as the resistive load. At this moment, the total impedance of the coil matching network is the minimum for the impedances represented by the points of the curve in FIG. 3, which is corresponding to the lowest point of the curve in FIG. 3. With the junction capacitance of the varactor diode 1026 further increasing, the capacitance reactance decreases more and more. As the capacitance reactance being smaller than the inductance reactance, the coil matching network may be acting as the inductive load. Thus, the total impedance of the coil matching network may increase which is shown in right portion of the curve.

Therefore, the impedance of the varactor diode 1026 may vary according to the reverse voltage applied on the two terminals of the varactor diode 1026. That is, by applying a different reverse voltage on the varactor diode 1026, the impedance of the varactor diode 1026 may be different. It may change the output voltage, by the spectrometer 106, so as to change the impedance of the varactor diode 1026 and change the impedance of the coil matching circuit 102. Therefore, the equivalent impedance of the coil matching circuit 102 and the RF transmission coil 101 can be changed. When the equivalent impedance of the coil matching circuit 102 and the RF transmission coil 101 is matching with the impedance of the transmission lines, e.g., the equivalent impedance of the coil matching circuit 102 and the RF transmission coil 101 is equal to the impedance of the transmission lines, the impedance matching of the magnetic resonance imaging system can be achieved.

According to an example, the varactor diodes 1026 of the matching circuit 102 may use a varactor diode with a large variation range of the junction capacitance. For example, a varactor diode with the variation range of the junction capacitance between 0.18 pF to 22 pF may be used in the coil matching circuit 102.

The RF power detection circuit 104 may comprise a first directional coupler 111 and a second directional coupler 112. Where, directional couplers may be passive devices used in the field of radio technology and couple a defined amount of the electromagnetic power in a transmission line to a port enabling the signal to be used in another circuit. A feature of directional couplers is that they only couple power flowing in one direction, and directional coupler are most frequently constructed from two coupled transmission lines set close enough together such that energy passing through one is coupled to the other. In the present example, an input terminal 1111 of the first directional coupler 1111 is coupled to a second output terminal 1062 of the spectrometer 106 through the RF amplifier 105. An output terminal 1112 of the first directional coupler 111 is connected to an output terminal 1122 of the second directional coupler 112. A coupling terminal 1113 of the first directional coupler 111 is connected to a first input terminal 1063 of the spectrometer 106. An input terminal 1121 of the second directional coupler 112 is connected to the coil interface circuit 103. A coupling terminal 1123 of the second directional coupler 112 is connected to a second input terminal 1064 of the spectrometer 106.

The two directional couplers 111, 112 of the RF power detection circuit 104 may be connected back-to-back, e.g., the output terminal 1112 of the first directional coupler 111 is directly connected to the output terminal 1122 of the second directional coupler 112. It should be noted that the input and output terminals of the directional couplers 111, 112 may be bi-directional, and that the coupling terminal 1113 and coupling terminal 1123 may be only used for outputting. Each time the first output terminal 1061 of the spectrometer 106 outputs an output voltage, the second output terminal 1062 of the spectrometer 106 may output a RF transmission signal to the RF power detection circuit 104 through the RF amplifier 105, where the central frequency, phase, and amplitude of the RF transmission signal may remain constant. When the RF transmission signal is transmitted through the RF power detection circuit 104, the first directional coupler 111 may output the RF transmission signal to the second directional coupler 112, so that the second directional coupler 112 may transmit the RF transmission signal to the coil interface circuit 103. At the same time, the coupling terminal 1113 of the first directional coupler 111 may output the power of the RF forward signal. A partial of the RF transmission signal may be reflected by the interface of the RF transmission lines. The coupling terminal 1123 of the second directional coupler 112 may output the power of the RF reflected signal.

For the person skilled in the art, it may use other couplers to achieve the function of the RF power detection circuit 104 of the present disclosure. For example, it may use a four port directional coupler for directly obtaining the RF forward signal and the RF reflected signal, and thus a detailed description therefor is deemed unnecessary.

As implementing the impedance matching of the RF transmission coil, the first output terminal 1061 of the spectrometer 106 may repeatedly, e.g., cyclically, output a plurality of voltages to the third input terminal 1025 of the coil matching circuit 102. Each of the plurality of voltages is reversely applied on the varactor diode 1026 through the RF blocking device 1027, 1028 to change the impedance of the coil matching circuit 102. For example, each time the first output terminal 1061 of the spectrometer 106 outputs an output voltage, the second output terminal 1062 of the spectrometer 106 may output a RF transmission signal. The coupling terminal 1113 of the first directional coupler 111 may output the power of the RF forward signal to the first input terminal 1063 of the spectrometer 106. The coupling terminal 1123 of the second directional coupler 112 may output the power of the RF reflected signal to the second input terminal 1064 of the spectrometer 106. Thus, when a minimum power of the RF reflected signal received by the spectrometer 106 is determined, the spectrometer 106 may assign the output voltage output from the first output terminal 1061 which corresponds to the minimum power of the RF reflected signal as an impedance matching voltage.

Figure 4:
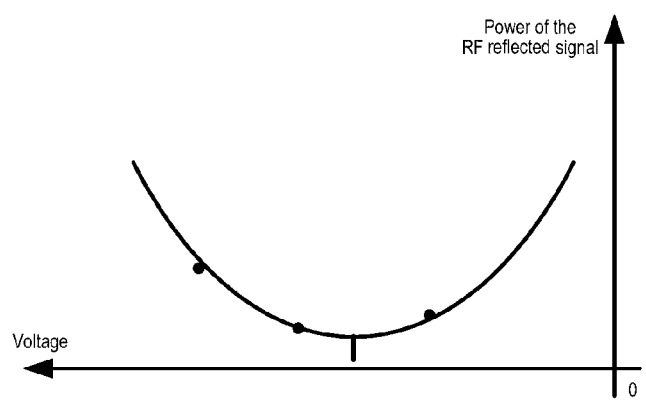
FIG. 4 is a schematic diagram of an example relationship of a voltage outputted by a spectrometer and a power of the RF reflected signal.

In practice, the equivalent impedance of the RF transmission coil 101 and the coil matching circuit 102 may be difficult to detect. It may be considered to indirectly detect the impedance matching between the equivalent impedance and the impedance of the transmission lines. For example, when an output voltage is outputted by the spectrometer 106 such that the power of the RF reflected signal is the minimum, it may be considered the equivalent impedance is matching with the impedance of the transmission lines. FIG. 4 is a schematic diagram of a relationship of the voltage and the power of the RF reflected signal. The voltage is outputted by the spectrometer 106.

From the aforementioned description, it may be known that, in the present disclosure, each time the spectrometer 106 outputs an output voltage, the equivalent impedance of the RF transmission coil 101 and the coil matching circuit 102 may change. The spectrometer 106 may receive the power of the RF forward signal from the coupling terminal 1113 of the first directional coupler 111 and the power of the RF reflected signal from the coupling terminal 1123 of the second directional coupler 112, where the power of the RF forward signal and the power of the RF reflected signal are corresponding to the output voltage. Therefore, the spectrometer 106 may search for the minimum power of the RF reflected signal, find the corresponding output voltage, and assign the output voltage as an impedance matching voltage. At this moment, it may determine that the equivalent impedance of the RF transmission coil 101 and the coil matching circuit 102 is matching with the impedance of the transmission lines. To directly detect the equivalent impedance of the RF transmission coil 101 and the coil matching circuit 102 may be not necessary. In other words, by outputting different voltages from the spectrometer 106, e.g., into the coil matching circuit 102, it may find the impedance matching voltage such that the equivalent impedance may be matching with the impedance of the transmission lines. Then, the spectrometer 106 may use the impedance matching voltage and output to the coil matching circuit 102 so as to automatically adjust the impedance matching of the magnetic resonance imaging system.

In a specific implementation, the radio frequency transmission coil 101 may comprise N antennas, where N is an integer greater than or equal to 1. In this situation, the coil matching circuit 102 comprises N sets of varactor diodes and RF blocking devices, respectively. Accordingly, there are N sets of DC blocking devices for connecting the radio frequency transmission coil 101 and the coil matching circuit 102, and N sets of DC blocking devices for connecting coil interface circuit 103 and the coil matching circuit 102.

For the person skilled in the art, in the coil matching circuit 102, the varactor diode may be connected to resistors, capacitors, inductors, and other components in parallel/series to form the coil matching circuit 102. The varactor diode may be connected to additional varactor diodes to help implementing the impedance matching. The followings may describe the different structure of the coil matching circuit 102 with reference figures.

Figure 5:
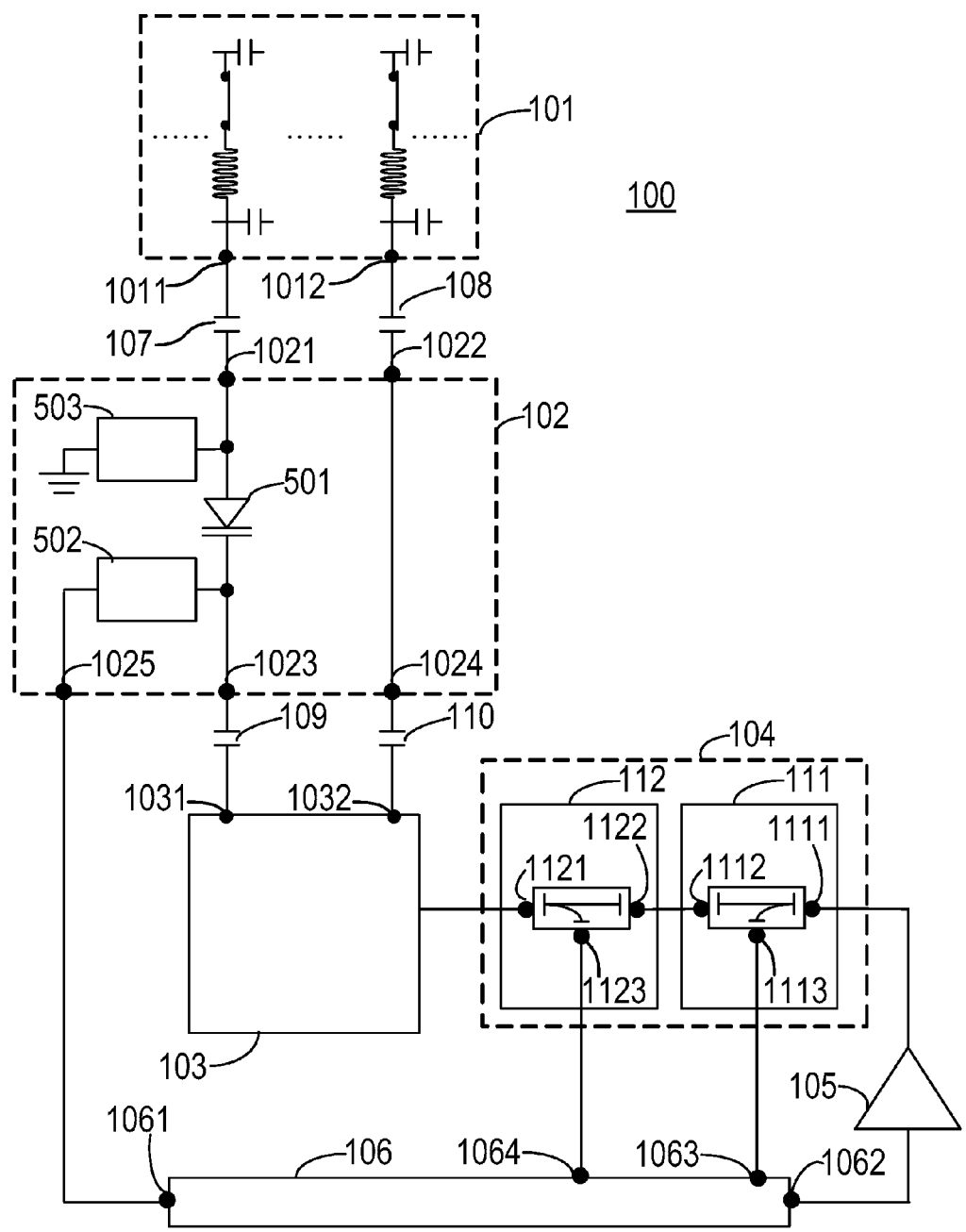
FIG. 5 is a schematic diagram of a structure of a coil matching circuit according to an example of the present disclosure.

FIG. 5 is a schematic diagram of a structure of the coil matching circuit 102 according to an example of the present disclosure. As shown in FIG. 5, the coil matching circuit 102 may comprise a varactor diode 501, and two RF blocking devices 502, 503.

As shown in FIG. 5, the first terminal of the first RF blocking device 502 is the third input terminal 1025 of the coil matching circuit 102. The second terminal of the first RF blocking device 502 is connected to a cathode of the varactor diode 501. The anode of the varactor diode 501 is coupled to a ground through the second RF blocking device 503. The cathode of the varactor diode 501 is the first input terminal 1023 of the coil matching circuit 102. The anode of the varactor diode 501 is the first output terminal 1021 of the coil matching circuit 102. The second output terminal 1022 of the coil matching circuit 102 is shorted with the second input terminal 1024 of the coil matching circuit 102.

In the example of the FIG. 5, the coil matching circuit 102 may comprise only one varactor diode 501. The first output terminal 1061 of the spectrometer 106 may output an output voltage to the first terminal of the first RF blocking device 502 of the coil matching circuit 102. The output voltage is reversely applied on the varactor diode 501 of the coil matching circuit 102 to change the impedance of the varactor diode 501.

Figure 6:
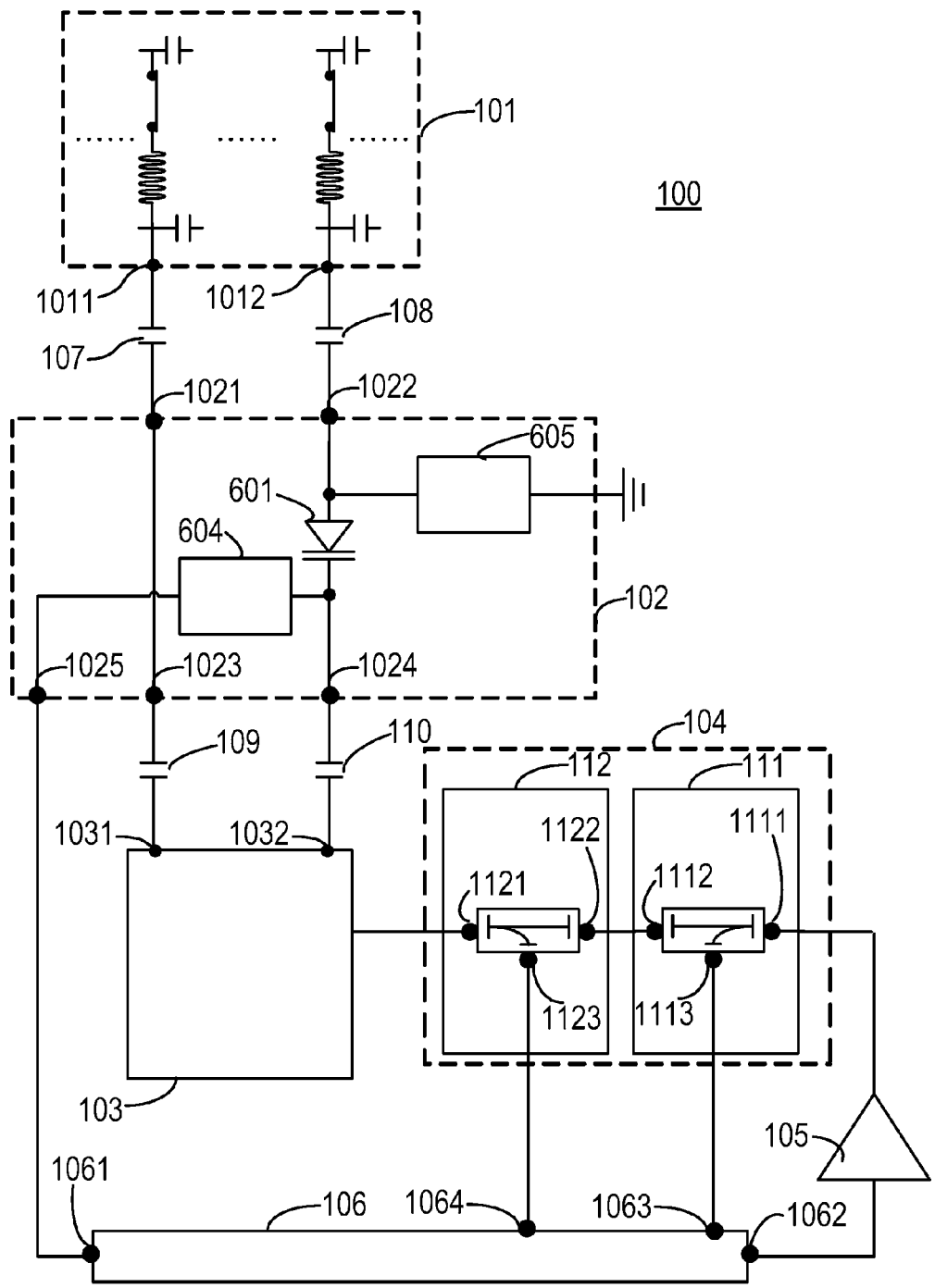
FIG. 6 is a schematic diagram of a structure of a coil matching circuit according to another example of the present disclosure.

FIG. 6 is a schematic diagram of a structure of the coil matching circuit 102 according to another example of the present disclosure. As shown in FIG. 6, the coil matching circuit 102 may comprise a varactor diode 601, and two RF blocking devices 604, 605.

As shown in FIG. 6, the first output terminal 1021 of the coil matching circuit 102 is shorted with the first input terminal 1023 of the coil matching circuit 102. The first terminal of the third RF blocking device 604 is the third input terminal 1025 of the coil matching circuit 102. The second terminal of the third RF blocking device 604 is connected to the cathode of the varactor diode 601. The anode of the varactor diode 601 is coupled to a ground through the fourth RF blocking device 605. The cathode of the varactor diode 601 is the second input terminal 1024 of the coil matching circuit 102. The anode of the varactor diode 601 is the second output terminal 1022 of the coil matching circuit 102.

In the example of the FIG. 6, the coil matching circuit 102 may comprise only one varactor diode 601. The first output terminal 1061 of the spectrometer 106 may output an output voltage to the first terminal of the third RF blocking device 604 of the coil matching circuit 102. The output voltage is reversely applied on the varactor diode 601 of the coil matching circuit 102 to change the impedance of the varactor diode 601.

Figure 7:
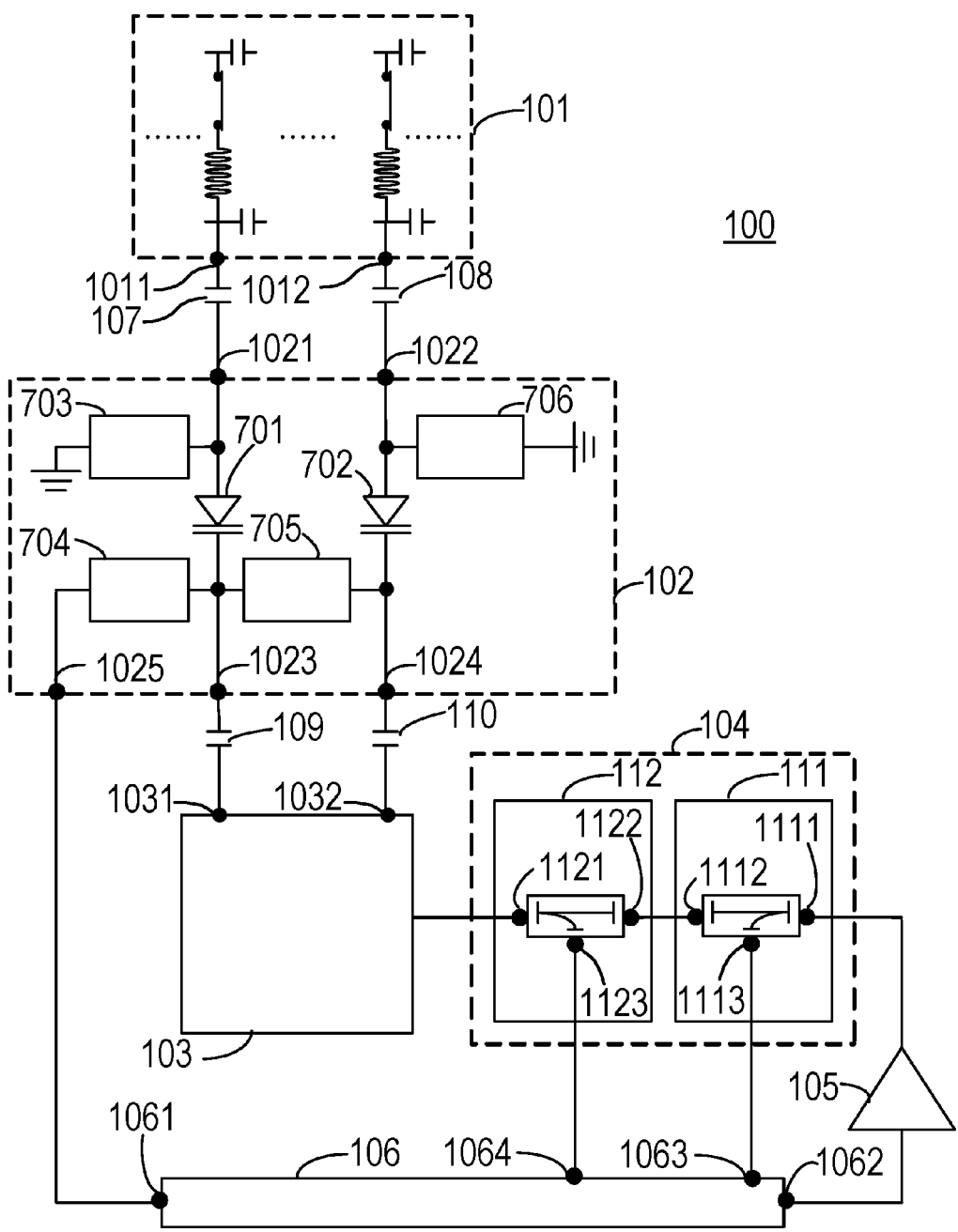
FIG. 7 is a schematic diagram of a structure of a coil matching circuit according to another example of the present disclosure.

FIG. 7 is a schematic diagram of a structure of the coil matching circuit 102 according to a still example of the present disclosure. As shown in FIG. 7, the coil matching circuit 102 may comprise two varactor diodes 701, 702, and four RF blocking devices 703, 704, 705, 706.

As shown in FIG. 7, a first terminal of the first RF blocking device 704 is the third input terminal 1025 of the coil matching circuit 102. The second terminal of the first RF blocking device 704 is connected to a cathode of the first varactor diode 701. The anode of the first varactor diode 701 is coupled to a ground through the second RF blocking device 703. The cathode of the first varactor diode 701 is the first input terminal 1023 of the coil matching circuit 102. The anode of the first varactor diode 701 is the first output terminal 1021 of the coil matching circuit 102.

The second terminal of the first RF blocking device 704 is connected to a first terminal of the third RF blocking device 705. The second terminal of the third RF blocking device 705 is connected to a cathode of the second varactor diode 702. The anode of the second varactor diode 702 is coupled to a ground through the fourth RF blocking device 706. The cathode of the second varactor diode 702 is the second input terminal 1024 of the coil matching device 102. The anode of the second varactor diode 702 is the second output terminal 1022 of the coil matching device 102.

In the example of the FIG. 7, the coil matching circuit 102 may comprise the first varactor diode 701 and the second varactor diode 702. The first output terminal 1061 of the spectrometer 106 may output an output voltage to the first terminal of the first RF blocking device 704 of the coil matching circuit 102. The output voltage is reversely applied on the first varactor diode 701 and the second varactor diode 702 to change the impedances of the first varactor diode 701 and the second varactor diode 702, respectively. The structure of the coil matching circuit 102 shown in FIG. 7 may have a larger variation range of the impedance than those of the structure of the coil matching circuits 102 shown in FIG. 5 and FIG. 6. For example, the variation range of the impedance in the structure shown in FIG. 7 may be twice of those in the structures shown in FIG. 5 and FIG. 6.

Figure 8:
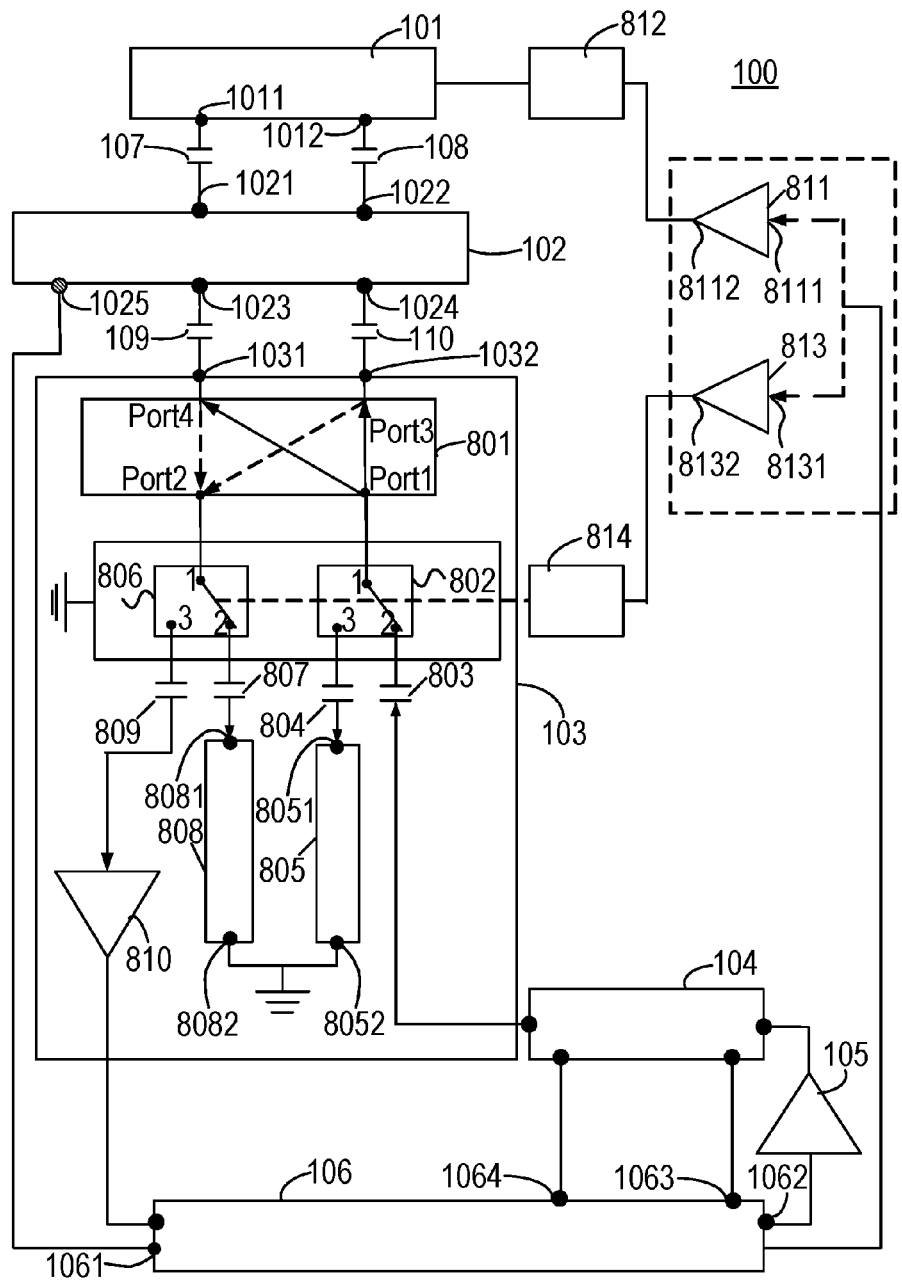
FIG. 8 is a schematic diagram of a structure of a coil interface circuit according to an example of the present disclosure.

FIG. 8 is a schematic diagram of a structure of the coil interface circuit 103 according to an example of the present disclosure. As shown in FIG. 8, the coil interface circuit 103 may comprise a RF power divider/mixer 801, a first RF switch 802, a second RF switch 806, a fifth DC blocking device 803, a sixth DC blocking device 804, a seventh DC blocking device 807, an eighth DC blocking device 809, a transmission power absorption load 808, a reception power absorption load 805, and/or a preamplifier 810.

As shown in FIG. 8, a first terminal of the RF power divider/mixer 801 is connected to a first terminal of the first RF switch 802, wherein the first terminal of the RF power divider/mixer 801 may illustrate as "Port 1" shown in FIG. 8. The second terminal of the first RF switch 802 is coupled to RF power detection circuit 104 through the fifth DC blocking device 803. The third terminal of the first RF switch 802 is coupled to a first terminal 8051 of the reception power absorption load 805 through the sixth DC blocking device 804, and a second terminal 8052 of the reception power absorption load 805 is connected to the ground.

The second terminal of the RF power divider/mixer 801 is connected to a first terminal of the second RF switch 806, wherein the second terminal of the RF power divider/mixer 801 may illustrate as "Port 2" shown in FIG. 8. The second terminal of the second RF switch 806 is coupled to a first terminal 8081 of the transmission power absorption load 808 through the seventh DC blocking device 807. A second terminal 8082 of the transmission power absorption load 808 is connected to the ground. The third terminal of the second RF switch 606 is coupled to the preamplifier 810 through the eighth DC blocking device 809. The preamplifier 810 is connected to the spectrometer 106.

The third terminal of the RF power divider/mixer 801 may illustrate as "Port 3" shown in FIG. 8. That is, the third terminal of the RF power divider/mixer 801 is the second output terminal 1032 of the coil interface circuit 103, and the second input terminal 1024 of the coil matching circuit 102 may be coupled to the second output terminal 1032 of the coil interface circuit 103 through the fourth DC blocking device 110. The fourth terminal of the RF power divider/mixer 801 may illustrate as "Port 4" shown in FIG. 8. The fourth terminal of the RF power divider/mixer 801 is the first output terminal 1031 of the coil interface circuit 103, and the first input terminal 1023 of the coil matching circuit 102 may be coupled to the first output terminal 1031 of the coil interface circuit 103 through the third DC blocking device 109.

In the example shown in FIG. 8, the impedance matching circuit 100 for a RF transmission coil 101 may further comprise a first switch signal driver 811 and a second switch signal driver 813.

As shown in FIG. 8, the first switch signal driver 811 has a first terminal 8111 which is connected to the spectrometer 106, and a second terminal 8112 which is coupled to the RF transmission coil 101 through a fifth RF blocking device 812. Thus, the first switch signal driver 811 may receive a coil state control signal from the spectrometer 106, and the first switch signal driver 811 may transmit a coil detuning state driving signal or a resonant state driving signal to the RF transmission coil 101.

The second switch signal driver 813 has a first terminal 8131 which is connected to the spectrometer 106, and a second terminal 8132 which is coupled to the first RF switch 802 and the second RF switch 806 through a sixth RF blocking device 814. Thus, the second switch signal driver 813 may receive a coil state control signal from the spectrometer 106, and the second switch signal driver 813 transmits a RF transmission state driving signal or a RF reception state driving signal to the first RF switch 802 and the second RF switch 806.

In the RF transmission state, the RF power divider/mixer 801 may complete the quadrature output of RF power. In the RF reception state, the RF power divider/mixer 801 may complete the mixing output of a RF received signal. In the RF reception state, the preamplifier 810 may amplify the received RF signal. The transmission power absorption load 808 is a load which may absorb the output power of the coupling terminal of the RF power divider/mixer 801 so as to achieve the load balance in the RF transmission state. The reception power absorption load 805 is a load which may absorb the output power of the coupling terminal of the RF power divider/mixer 801 so as to achieve the load balance in the RF reception state. For example, each of the transmission power absorption load 808 and the reception power absorption load 805 may be a load with 50 ohms which is consistent with a signal transmission mechanism of components for transmitting a RF signal.

The first switch signal driver 811 may transmit a coil detuning state driving signal or a resonant state driving signal to the RF transmission coil 101 for controlling the RF transmission coil 101 to be in a detuning state or in a resonant state. The second switch signal driver 813 may transmit a RF transmission state driving signal or a RF reception state driving signal to the first RF switch 802 and the second RF switch 806. Therefore, it may control the first RF switch 802 and the second RF switch 806 to be switched between the RF transmission state and the RF reception state. In the adjustment process of the impedance matching of the RF transmission coil 101, the RF transmission coil 101 may be in the resonant state and the first RF switch 802 and the second RF switch 806 may be in the RF transmission state.

From the aforementioned description, in the impedance matching circuit 100 of the present disclosure, by outputting different voltages from the spectrometer 106, it may find the impedance matching voltage such that the equivalent impedance may be matching with the impedance of the transmission lines. Then, the spectrometer 106 may output the impedance matching voltage so as to automatically adjust the equivalent impedance to match with the impedance of the transmission lines. Thus, it may achieve a high speed adjustment with high precision.

Figure 9:
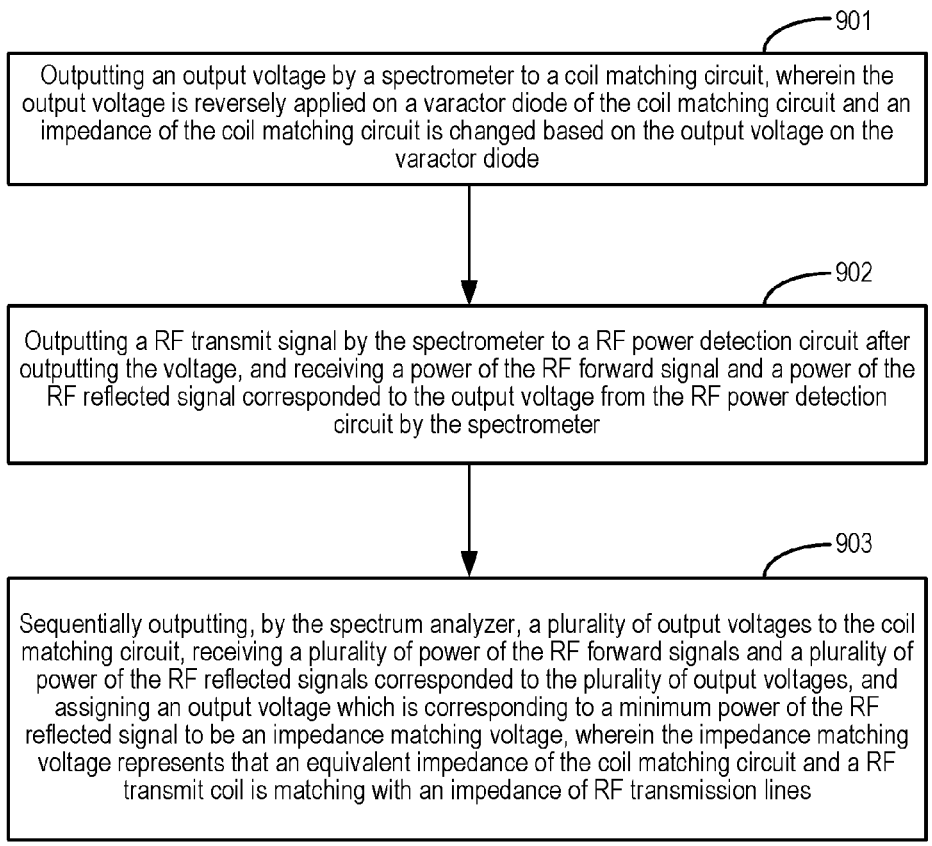
FIG. 9 is a flowchart of an impedance matching method for radio frequency transmission coil according to an example of the present disclosure.

FIG. 9 is a flowchart of impedance matching method for radio frequency transmission coil according to an example of the present disclosure. The impedance matching method may be executed by the impedance matching circuit 100, e.g., the spectrometer 106, of FIG. 1. The impedance matching method may comprise block 901 to block 903.

In block 901, the spectrometer 106 outputs an output voltage to the coil matching circuit 102, and the output voltage is reversely applied on the varactor diode 1026 of the coil matching circuit 102. The output voltage which is reversely applied on the varactor diode 1026 may change the impedance of the varactor diode 1026 and thus the impedance of the coil matching circuit 102.

In block 902, after outputting the output voltage, the spectrometer 106 may output a RF transmission signal to a RF power detection circuit 104 through the RF amplifier 105, and receive a power of the RF forward signal and a power of the RF reflected signal corresponded to the output voltage from the RF power detection circuit 104.

In block 903, the spectrometer 106 may repeatedly, e.g., cyclically, output the output voltage to the coil matching circuit 102, receive the power of the RF forward signals and the power of the RF reflected signals corresponded to the output voltage, and assign an output voltage to be an impedance matching voltage, wherein the output voltage is corresponding to a minimum power of the RF reflected signal. When the spectrometer 106 outputs the impedance matching voltage, it may represent that an equivalent impedance of the coil matching circuit 102 and the RF transmission coil 101 is matching with an impedance of the RF transmission lines, wherein the equivalent impedance is the sum of impedance of the coil matching circuit1 102 and impedance of the RF transmission coil 101.

The spectrometer 106 may repeatedly, e.g., cyclically, output the output voltage to the coil matching circuit 102. The output voltage may be reversely applied on the varactor diode 1026 of the coil matching circuit 102. The junction capacitance of the varactor diode 1026 is decreasing when the reverse voltage applied on the varactor diode 1026 is increasing. The variation of the junction capacitance of the varactor diode 1026 may change the impedance of the varactor diode 1026. Therefore, the equivalent impedance of the coil matching circuit1 102 and the RF transmission coil 101 may be changed as a result of the change of the impedance of the varactor diode 1026.

Each time the spectrometer 106 outputs an output voltage to the coil matching circuit 102, the spectrometer 106 may output a RF transmission signal to the RF power detection circuit 104 through the RF amplifier 105. The spectrometer 106 may receive the power of the RF forward signal and the power of the RF reflected signal corresponded to the output voltage. When the power of the RF reflected signal obtained by the spectrometer 106 is the minimum, it may represent that the equivalent impedance is matching with the impedance of the transmission lines and may achieve the impedance matching of the magnetic resonance imaging system. Therefore, the spectrometer 106 may assign the output voltage as an impedance matching voltage.

The impedance matching method of the present disclosure may automatically find the impedance matching voltage which may be used to adjust the equivalent impedance of the coil matching circuit1 102 and the RF transmission coil 101 to match with the impedance of the transmission lines. In the scanning process of the magnetic resonance imaging system, the spectrometer 106 may output the impedance matching voltage to automatically adjust the impedance of the magnetic resonance imaging system for ensuring the quality of magnetic resonance images.

It would be noted that, in the practical application, it may set an initial output voltage range in advanced. The initial output voltage range has a maximum value and a minimum value of the output voltages which are outputted by the spectrometer 106. In the initial output voltage range, the spectrometer 106 may repeatedly, e.g., cyclically, output the output voltage, e.g., from the maximum value to the minimum value or from the minimum value to the maximum value. Thus, the spectrometer 106 may automatically find the impedance matching voltage. In general, each output voltage may be outputted one time, and the spectrometer 106 can find the impedance matching voltage. According to an example, in order to ensure the impedance matching voltage more accurate, the spectrometer 106 may repeatedly, e.g., cyclically, output the output voltage to find the impedance matching voltage. For example, the spectrometer 106 may output the output voltage at least twice to find the impedance matching voltage.

It would be noted that, the voltage outputted by the spectrometer 106 may be reversely applied on one varactor diode of the coil matching circuit 102 as shown in FIG. 5 and FIG. 6. The voltage outputted by the spectrometer 106 may be reversely applied on two varactor diodes which are connected in parallel of the coil matching circuit 102 as shown in FIG. 7. It can reference the descriptions of the coil matching circuit 102 of the present disclosure, and thus a detailed description therefor is deemed unnecessary.

Figure 10:
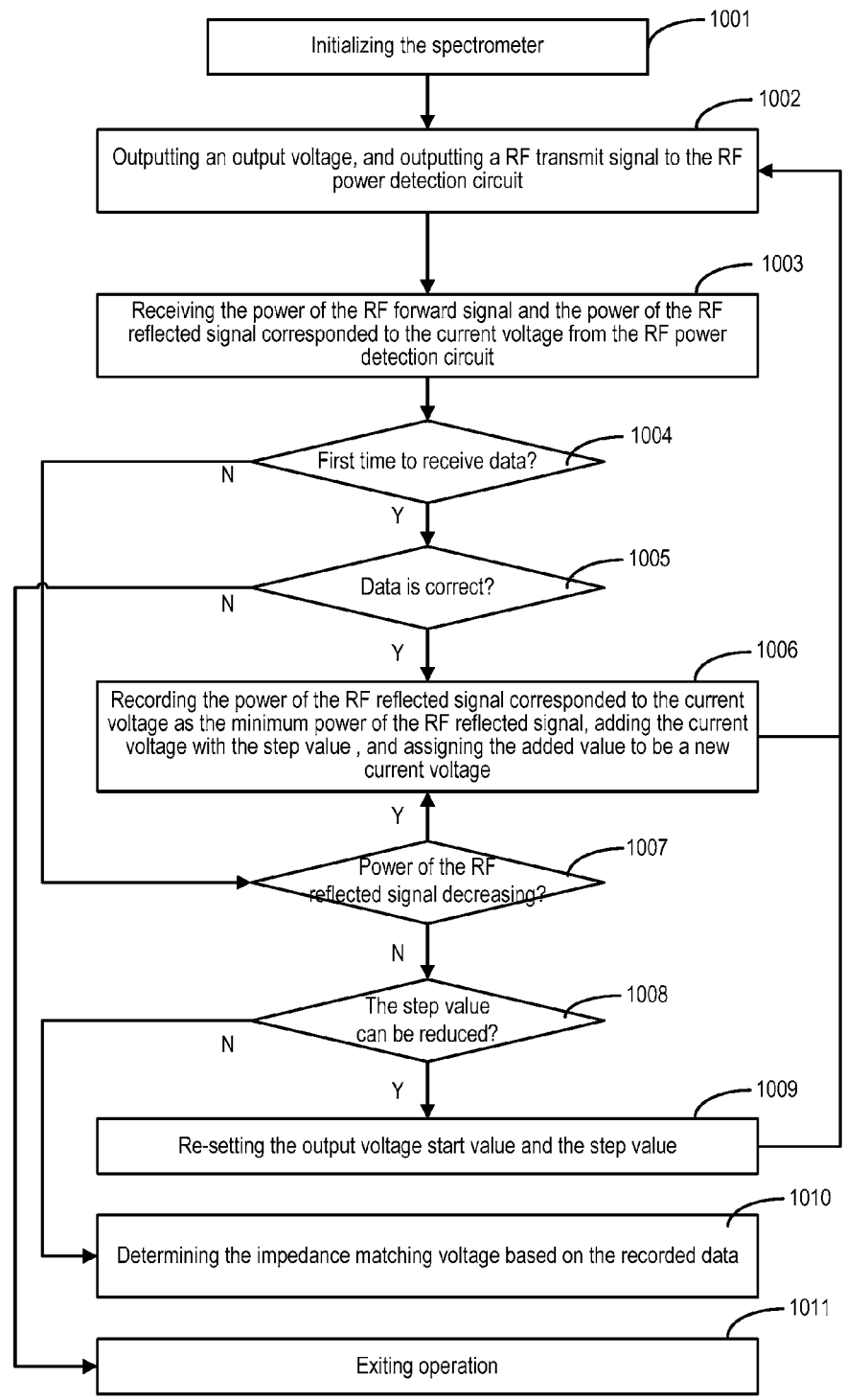
FIG. 10 is a flowchart of an impedance matching method for radio frequency transmission coil according to another example of the present disclosure.

FIG. 10 is a flowchart of an impedance matching method for radio frequency transmission coil according to another example of the present disclosure. The impedance matching method may be executed by the impedance matching circuit 100, e.g., the spectrometer 106, of FIG. 1. The impedance matching method may comprise block 1001 to block 1011.

In block 1001, the spectrometer 106 is initialized. In some implementations, the spectrometer 106 may set up an output voltage start value, a step value, a step difference value, a minimum step value, and/or a maximum voltage standing wave ratio.

In block 1002, the spectrometer 106 may output an output voltage to the coil matching circuit 102, and output a RF transmission signal to the RF power detection circuit 104. The value of the output voltage may be the output voltage start value, or may be the output voltage start value plus N step values, where N is an integer greater than or equal to 1.

In block 1003, the spectrometer 106 may receive the power of the RF forward signal and the power of the RF reflected signal corresponded to the output voltage from the RF power detection circuit 104.

In block 1004, the spectrometer 106 may determine whether it is the first time for the spectrometer 106 to receive the data. If the spectrometer 106 is the first time to receive the data, the spectrometer 106 executes block 1005, otherwise, the spectrometer 106 executes block 1007.

In block 1005, the spectrometer 106 may determine whether the data received is correct or not, and if the data received is correct, executing block 1006, otherwise, executing block 1011.

According to an example, in block 1005, the spectrometer 106 may calculate a voltage standing wave ratio according to the power of the RF forward signal and the power of the RF reflected signal which are received by the spectrometer 106 at the first time. The spectrometer 106 may determine whether the calculated voltage standing wave ratio is greater than the pre-determined maximum voltage standing wave ratio. If the calculated voltage standing wave ratio is not greater than (e.g., less than or equal to) the pre-determined maximum voltage standing wave ratio, it may represent that the data received is correct and block 1006 is executed. If the calculated voltage standing wave ratio is greater than the pre-determined maximum voltage standing wave ratio, it may represent that the data received is not correct and block 1011 is executed.

In a particular example, the spectrometer 106 may use the following equation to calculate the voltage standing wave ratio (VSWR):

$$VSWR = \frac{1 + \frac{\text{power of the } RF \text{ feedback signal}}{\text{power of the } RF \text{ feedforward signal}}}{1 - \frac{\text{power of the } RF \text{ feedback signal}}{\text{power of the } RF \text{ feedforward signal}}}.$$

In block 1006, the spectrometer 106 may assign the power of the RF reflected signal corresponded to the current output voltage as the minimum power of the RF reflected signal, add the value of the current output voltage with the step value, assign the added value to be a new value of the output voltage, and then execute block 1002.

In block 1007, the spectrometer 106 may determine whether the power of the RF reflected signal is decreasing or not, and if the power of the RF reflected signal is decreasing, executing block 1006, otherwise, executing block 1008.

According to an example, in block 1007, the spectrometer 106 may compare the power of the RF reflected signal corresponded to the current output voltage to the minimum power of the RF reflected signal. If the power of the RF reflected signal corresponded to the current output voltage is less than the minimum power of the RF reflected signal, then it may represent that the power of the RF reflected signal is decreasing. It may indicate that a power of the RF reflected signal which is less than the power of the RF reflected signal corresponded to the current output voltage. In this case, it may execute block 1006 to record the power of the RF reflected signal corresponded to the current output voltage as the minimum power of the RF reflected signal, add the value of the current output voltage with the step value, assign the added value to be a new value of the output voltage, and execute block 1002.

However, if the power of the RF reflected signal corresponded to the current output voltage is greater than or equal to the minimum power of the RF reflected signal, then it may represent that the current output voltage exceed the impedance matching voltage. In this case, it may execute block 1008.

In block 1008, the spectrometer 106 may determine whether the step value can be reduced, and if the step value can be further reduced, executing block 1009. In this case, it may indicate that the current step value can be further reduced in order to improve detection accuracy, and the spectrometer 106 executes block 1009 to reset the output voltage start value and step value. Otherwise, it may indicate that the current step value has reached the minimum, and the spectrometer 106 executes block 1010.

According to an example, in block 1008, the spectrometer 106 may determine whether the difference between the current step value and the step difference value is greater than the minimum step value. If yes, it may represent that the current step value can be further reduced and the spectrometer 106 may execute block 1009 to reset the step value. Otherwise, it may represent that the current step value is not appropriate to further reduce and the spectrometer 106 may execute block 1010 to determine the impedance matching voltage according the recorded data.

In block 1009, the spectrometer 106 may reset the output voltage start value and the step value and execute block 1002 again.

FIG. 11 is a schematic diagram of pseudo-code corresponding to block 1009 according to an example of the present disclosure. As shown in FIG. 11, if the power of the RF reflected signal corresponded to the current output voltage is equal to the minimum power of the RF reflected signal, the spectrometer 106 may assign the voltage corresponding to the minimum power of the RF reflected signal to be a new value of the output voltage start value, subtract the current step value with a predetermined step difference value and assign the subtracted step value to be a new value of the step value, and add the new output voltage start value and the new step value and assign the added value to be a new value of the current output voltage. Then, the spectrometer 106 may execute block 1002 again.

If the power of the RF reflected signal corresponded to the current outputted voltage is greater than the minimum power of the RF reflected signal, the spectrometer 106 may subtract the voltage corresponding to the minimum power of the RF reflected signal with the current step value and assign the subtracted value to be a new value of the output voltage start value, and subtract the current step value with the predetermined step difference value and assign the subtracted step value to be a new value of the step value. The spectrometer 106 may compare the output voltage start value to a previous output voltage start value. If the output voltage start value is less than the previous output voltage start value, it may indicate that there may be equipment failure and the spectrometer 106 may execute the exit operation. Otherwise, the spectrometer 106 may sum the new output voltage start value and the new step value and assign the summed value to be a new value of the output voltage, and then execute block 1002.

In block 1010, the spectrometer 106 may determine the impedance matching voltage based on the recorded data.

According to an example, the spectrometer 106 may compare the power of the RF reflected signal corresponded to the current output voltage to the minimum power of the RF reflected signal. If the power of the RF reflected signal corresponded to the current output voltage is equal to the minimum power of the RF reflected signal, the spectrometer 106 may assign a mean value of the current output voltage and the previous output voltage as the impedance matching voltage. If the power of the RF reflected signal corresponded to the current output voltage is greater than the minimum power of the RF reflected signal, the spectrometer 106 may assign the voltage which is corresponding to the minimum power of the RF reflected signal as an impedance matching voltage.

In block 1011, the spectrometer 106 may execute the exit operation.

In comparison with the method in FIG. 9, according to the method in FIG. 10, the spectrometer 106 may first use a large step value to sample the waveform of the RF reflected signal in order to find an approximation range of the power of a RF reflected signal. In the approximation range, the power of a RF reflected signal may be first decreasing and then increasing again. Then, in a range comprising at most three sample points, the spectrometer 106 may resample by increasing the sample rate in the range. The spectrometer 106 may cyclically perform the aforementioned method until the step value cannot be reduced. The spectrometer 106 may find the minimum power of the RF reflected signal and assign the output voltage as the impedance matching voltage.

The output voltage of the spectrometer 106 is from low voltage to high voltage. It is obvious that the spectrometer 106 may output the output voltage from high voltage to low voltage, and thus a detailed description therefor is deemed unnecessary. The spectrometer 106 may also output the output voltage in any order, e.g., randomly.

The impedance matching voltage of the method in FIG. 10 may be more accurate than that of the method in FIG. 9. Moreover, according to the method in FIG. 10, the spectrometer 106 may obtain the impedance matching voltage faster than that of the method in FIG. 9.

The above are only preferred examples of the present disclosure is not intended to limit the disclosure within the spirit and principles of the present disclosure, any changes made, equivalent replacement, or improvement in the protection of the present disclosure should contain within the range.

The methods, processes and units described herein may be implemented by hardware (including hardware logic circuitry), software or firmware or a combination thereof. The term 'processor' is to be interpreted broadly to include a processing unit, ASIC, logic unit, or programmable gate array etc. The processes, methods and functional units may all be performed by the one or more processors; reference in this disclosure or the claims to a 'processor' should thus be interpreted to mean 'one or more processors'.

Further, the processes, methods and functional units described in this disclosure may be implemented in the form of a computer software product. The computer software product is stored in a storage medium and comprises a plurality of instructions for making a processor to implement the methods recited in the examples of the present disclosure.

The figures are only illustrations of an example, wherein the units or procedure shown in the figures are not necessarily essential for implementing the present disclosure. Those skilled in the art will understand that the units in the device in the example can be arranged in the device in the examples as described, or can be alternatively located in one or more devices different from that in the examples. The units in the examples described can be combined into one module or further divided into a plurality of sub-units.

Although the flowcharts described show a specific order of execution, the order of execution may differ from that which is depicted. For example, the order of execution of two or more blocks may be changed relative to the order shown Also, two or more blocks shown in succession may be executed concurrently or with partial concurrence. All such variations are within the scope of the present disclosure.

It is noted that the disclosure of impedance matching of the present disclosure refers to a different form of impedance matching than is typically described with respect to the impedance matching RF transmission coil with the transmission lines. The impedance matching of the present disclosure is the impedance matching of the equivalent impedance of the RF transmission coil and a RF matching circuit with the transmission lines. That is, the RF transmission coil and the RF matching circuit are regarded as a whole unit and the impedance matching of the present disclosure is the impedance matching between the equivalent impedance of the whole unit and the transmission lines. In the present disclosure, the equivalent impedance of the whole unit, which comprises the RF transmission coil and the RF matching circuit, is the sum of the impedance of the coil matching circuit and the impedance of the RF transmission coil.

For simplicity and illustrative purposes, the present disclosure is described by referring mainly to an example thereof. In the present disclosure, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Throughout the present disclosure, the word "comprise", or variations such as "comprises" or "comprising", will be understood to imply the inclusion of a stated element, integer or step, or group of elements, integers or steps, but not the exclusion of any other element, integer or step, or group of elements, integers or steps.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive. Accordingly, other embodiments are within the scope of the following claims.

The invention claimed is:

1. An impedance matching circuit for a radio frequency (RF) transmission coil, comprising:
   a coil interface circuit configured to output a RF transmission signal in a RF transmission state or to output a RF received signal in a RF reception state;
   a coil matching circuit serially coupled between the RF transmission coil and the coil interface circuit through a plurality of direct current (DC) blocking devices, the coil matching circuit comprising a varactor diode;
   a RF power detection circuit coupled to the coil interface circuit and configured to detect power of a RF forward signal and power of a RF reflected signal in the RF transmission state; and
   a spectrometer configured to:
      output an output voltage to the coil matching circuit, the output voltage being reversely applied on the varactor diode, an impedance of the coil matching circuit being changed based on the output voltage on the varactor diode,
      output a RF transmission signal to the RF power detection circuit after outputting the output voltage,
      receive the power of the RF forward signal and the power of the RF reflected signal corresponded to the output voltage, and
      assign a particular output voltage corresponding to a minimum power of the RF reflected signal as an impedance matching voltage which causes an equivalent impedance of the coil matching circuit and the RF transmission coil to match with an impedance of RF transmission lines.

2. The impedance matching circuit of claim 1, wherein the coil matching circuit further comprises a plurality of RF blocking devices, and
wherein the output voltage outputted from the spectrometer to the coil matching circuit is reversely applied on the varactor diode through the plurality of RF blocking devices.

3. The impedance matching circuit of claim 1, wherein:
a first output terminal of the coil matching circuit is coupled to a first input terminal of the RF transmission coil through a first DC blocking device of the plurality of DC blocking devices;
a second output terminal of the coil matching circuit is coupled to a second input terminal of the RF transmission coil through a second DC blocking device of the plurality of DC blocking devices;
a first input terminal of the coil matching circuit is coupled to a first output terminal of the coil interface circuit through a third DC blocking device of the plurality of DC blocking devices;
a second input terminal of the coil matching circuit is coupled to a second output terminal of the coil interface circuit through a fourth DC blocking device of the plurality of DC blocking devices; and
a third input terminal of the coil matching circuit is connected to a first output terminal of the spectrometer.

4. The impedance matching circuit of claim 3, wherein the coil matching circuit includes the varactor diode, a first RF blocking device, and a second RF blocking device, and
wherein:
a first terminal of the first RF blocking device is the third input terminal of the coil matching circuit;
a second terminal of the first RF blocking device is connected to a cathode of the varactor diode;
an anode of the varactor diode is coupled to a ground through the second RF blocking device;
the cathode of the varactor diode is the first input terminal of the coil matching circuit;
the anode of the varactor diode is the first output terminal of the coil matching circuit; and
the second output terminal of the coil matching circuit is shorted with the second input terminal of the coil matching circuit.

5. The impedance matching circuit of claim 3, wherein the coil matching circuit comprises the varactor diode, a third RF blocking device, and a fourth RF blocking device; and
wherein:
the first output terminal of the coil matching circuit is shorted with the first input terminal of the coil matching circuit;
a first terminal of the third RF blocking device is the third input terminal of the coil matching circuit;
a second terminal of the third RF blocking device is connected to a cathode of the varactor diode;
an anode of the varactor diode is coupled to a ground through the fourth RF blocking device;
the cathode of the varactor diode is the second input terminal of the coil matching circuit; and
the anode of the varactor diode is the second output terminal of the coil matching circuit.

6. The impedance matching circuit of claim 3, wherein the coil matching circuit includes a first varactor diode, a second varactor diode, a first RF blocking device, a second RF blocking device, a third RF blocking device, and a fourth RF blocking device; and
wherein:
a first terminal of the first RF blocking device is the third input terminal of the coil matching circuit;
a second terminal of the first RF blocking device is connected to a cathode of the first varactor diode;
an anode of the first varactor diode is coupled to a ground through the second RF blocking device;
the cathode of the first varactor diode is the first input terminal of the coil matching circuit;
the anode of the first varactor diode is the first output terminal of the coil matching circuit;
the second terminal of the first RF blocking device is connected to a first terminal of the third RF blocking device;
a second terminal of the third RF blocking device is connected to a cathode of the second varactor diode;
an anode of the second varactor diode is coupled to the ground through the fourth RF blocking device;
the cathode of the second varactor diode is the second input terminal of the coil matching device; and
the anode of the second varactor diode is the second output terminal of the coil matching device.

7. The impedance matching circuit of claim 1, wherein the RF power detection circuit includes a first directional coupler and a second directional coupler, and
wherein:
a terminal of the first directional coupler is coupled to a second output terminal of the spectrometer through a RF amplifier;
an output terminal of the first directional coupler is connected to an output terminal of the second directional coupler;
a coupling terminal of the first directional coupler is connected to a first input terminal of the spectrometer;
an input terminal of the second directional coupler is connected to the coil interface circuit; and
a coupling terminal of the second directional coupler is connected to a second input terminal of the spectrometer.

8. The impedance matching circuit of claim 7, wherein:
the second output terminal of the spectrometer outputs the RF transmission signal to the input terminal of the first directional coupler through the RF amplifier after outputting the output voltage from the first output terminal of the spectrometer to the coil matching circuit, and
the coupling terminal of the first directional coupler outputs the power of the RF forward signal corresponded to the output voltage to the first input terminal of the spectrometer, and the coupling terminal of the second directional coupler outputs the power of the RF reflected signal corresponded to the output voltage to the second input terminal of the spectrometer.

9. The impedance matching circuit of claim 1, wherein the coil interface circuit comprises at least one of a RF power divider/mixer, a first RF switch, a second RF switch, a fifth DC blocking device, a sixth DC blocking device, a seventh DC blocking device, an eighth DC blocking device, a transmission power absorption load, a reception power absorption load, or a preamplifier; and
wherein:
a first terminal of the RF power divider/mixer is connected to a first terminal of the first RF switch;

a second terminal of the first RF switch is coupled to the RF power detection circuit through the fifth DC blocking device;

a third terminal of the first RF switch is coupled to a first terminal of the reception power absorption load through the sixth DC blocking, and a second terminal of the reception power absorption load is connected to a ground;

a second terminal of the RF power divider/mixer is connected to a first terminal of the second RF switch;

a second terminal of the second RF switch is coupled to a first terminal of the transmission power absorption load through the seventh DC blocking, and a second terminal of the transmission power absorption load is connected to the ground;

a third terminal of the second RF switch is coupled to the preamplifier through the eighth DC blocking;

the preamplifier is connected to the spectrometer;

a third terminal of the RF power divider/mixer is coupled to a second input terminal of the coil matching circuit through a DC blocking device; and a fourth terminal of the RF power divider/mixer is coupled to a first input terminal of the coil matching circuit through a DC blocking device.

10. The impedance matching circuit of claim 9, wherein the coil interface circuit further comprises:

a first switch signal driver having a first terminal connected to the spectrometer and a second terminal coupled to the RF transmission coil through a fifth RF blocking device, the first switch signal driver receives a coil state control signal from the spectrometer, and the first switch signal driver transmits a coil detuning state driving signal or a resonant state driving signal to the RF transmission coil; and a second switch signal driver having a first terminal connected to the spectrometer and a second terminal coupled to the first RF switch and the second RF switch through a sixth RF blocking device, the second switch signal driver receives a coil state control signal from the spectrometer, and the second switch signal driver transmits a RF transmission state driving signal to the first RF switch and the second RF switch.

* * * * *